United States Patent [19]
Littau et al.

[11] Patent Number: 5,800,686
[45] Date of Patent: Sep. 1, 1998

[54] CHEMICAL VAPOR DEPOSITION CHAMBER WITH SUBSTRATE EDGE PROTECTION

[75] Inventors: Karl Littau, Sunnyvale; Lawrence Chung-lai Lei, Milpitas, both of Calif.

[73] Assignee: Applied Materials, Inc., Santa Clara, Calif.

[21] Appl. No.: 200,079

[22] Filed: Feb. 23, 1994

Related U.S. Application Data

[63] Continuation-in-part of Ser. No. 342,670, Nov. 21, 1994, Pat. No. 5,516,367, which is a continuation of Ser. No. 42,961, Apr. 5, 1993, abandoned.

[51] Int. Cl.⁶ .................................................. C23C 16/00
[52] U.S. Cl. ............... 204/298.07; 118/725; 204/298.11; 204/192.32
[58] Field of Search ................ 204/298.07, 298.11; 118/725

[56] References Cited

U.S. PATENT DOCUMENTS

| | | | |
|---|---|---|---|
| 4,209,357 | 6/1980 | Gorin et al. | 156/643 |
| 4,585,920 | 4/1986 | Hoog et al. | 219/121 PR |
| 4,872,947 | 10/1989 | Wang et al. | 156/643 |
| 4,892,753 | 1/1990 | Wang et al. | 427/38 |
| 5,198,034 | 3/1993 | Deboer et al. | 118/725 |
| 5,228,501 | 7/1993 | Tepman et al. | 165/80.1 |
| 5,231,690 | 7/1993 | Soma et al. | 392/416 |
| 5,238,499 | 8/1993 | van de Ven et al. | 118/724 |
| 5,252,131 | 10/1993 | Kiyama et al. | 118/725 X |
| 5,292,554 | 3/1994 | Sinha et al. | 118/725 X |
| 5,589,224 | 12/1996 | Tepman et al. | 118/725 X |

FOREIGN PATENT DOCUMENTS

| | | |
|---|---|---|
| 0456372A1 | 11/1991 | European Pat. Off. . |
| 0467623A2 | 1/1992 | European Pat. Off. . |
| 2171877 | 9/1973 | France . |
| WO9013687 | 11/1990 | WIPO . |
| WO 94/01597 | 1/1994 | WIPO . |

*Primary Examiner*—Janice L. Krizek
*Attorney, Agent, or Firm*—Patterson & Streets, L.L.P.

[57] ABSTRACT

An improved deposition chamber deposits useful layers on substrates. The improved chamber includes a substrate edge protection system which, in combination with a purge gas, protects selected portions of the edge and underside of the substrate from the deposition gas while preventing the creation of a masked area on the substrate edge. The substrate edge protection system includes a ring, which is received over a substrate received on the substrate support member and which is alignable with the substrate to provide a minimum gap between the edge of the substrate and the ring.

13 Claims, 6 Drawing Sheets

CHEMICAL VAPOR DEPOSITION CHAMBER WITH SUBSTRATE EDGE PROTECTION

This application is a continuation-in-part of U.S. patent application Ser. No. 08/342,670, filed Nov. 21, 1994, now U.S. Pat. No. 5,516,367, which is a continuation of U.S. patent application Ser. No. 08/042,961, filed Apr. 5, 1993, now abandoned.

BACKGROUND OF THE INVENTION

The present invention relates to methods and apparatus for depositing useful layers of materials on substrates used in the manufacture of semiconductor die. More particularly, the invention relates to improved apparatus and methods for use in the processing of substrates, such as by chemical vapor deposition.

Chemical vapor deposition, commonly referred to as "CVD," is used to deposit a thin layer of material on a semiconductor substrate. To process substrates with the CVD process, a vacuum chamber is provided with a susceptor configured to receive a substrate thereon. In a typical prior art CVD chamber, the substrate is placed into and removed from the chamber by a robot blade. The chamber includes an intermediate substrate positioning assembly on which the substrate is located when it is placed into, or about to be removed from, the chamber. To locate the substrate on the susceptor, the susceptor is passed through the center of the substrate positioning assembly to lift the substrate therefrom. The susceptor and the substrate are then heated to a temperature of between 250°-650° C. Once the substrate is located on the susceptor and heated to an appropriate temperature, a precursor gas is charged to the vacuum chamber through a gas manifold situated above the substrate. The precursor gas reacts with the heated substrate surface to deposit the thin material layer thereon. As the gas reacts to form the material layer, volatile byproduct gasses are formed, and these gasses are pumped out of the vacuum chamber through a chamber exhaust system.

A primary goal of substrate processing is to obtain as many useful die as possible from each substrate. Many factors influence the processing of substrates in the CVD chamber and affect the ultimate yield of die from each substrate processed therein. These factors include processing variables, which affect the uniformity and thickness of the deposition material layer deposited on the substrate, and contaminants that can attach to the substrate and contaminate one or more die therein. Both of these factors must be controlled in CVD and other processes to maximize the die yield from each substrate.

One CVD processing variable which affects the uniformity of the deposition material layer is the relative concentration of reacted and non-reacted process gas components in the deposition chamber. The exhaust system of the chamber includes a circumferential exhaust channel located above the substrate adjacent the perimeter thereof, through which the reacted process gas is vented. However, a gap exists in the circumferential exhaust channel where the slit valve for moving the substrate into and out of the chamber passes through the chamber wall. The exhausting of reacted gaseous products from the chamber is less efficient near this gap, and thus the exhausting of reaction products is non-uniform in the chamber. This contributes to the creation of non-uniform deposition material layers on the substrate, because the relative concentration of reactive gas in the total gas volume in the chamber varies about the surface of the substrate due to the non-uniform exhausting of reacted gaseous products from the chamber.

In addition to the foregoing factor which affects the uniformity and thickness of the deposition material layer, CVD processing chambers include multiple sources of particle contaminants which, if received on the substrate, reduce the die yield therefrom. One primary source of particulate contamination in CVD processing is the deposition material deposited on the chamber surfaces during processing. As the substrate is processed in the CVD chamber, a material layer is indiscriminately deposited on all surfaces within the chamber which are contacted with the gas, such as lamp covers. If these chamber surfaces are later touched or rubbed, or if the material layer is loosely attached to the chamber surface and the chamber is shaken or vibrated, particles of deposition material layer can become free in the chamber and contaminate the substrate. Additionally, the deposition material layer does not typically firmly attach itself to the edge and underside of the substrate, and the layer formed in that location of the substrate is known to flake off the substrate and become a particle contaminant.

One method of controlling particle generation in the chamber is to use a shadow ring to reduce the occurrence of the deposition layer on the edge and underside of the substrate. A shadow ring is a masking member, which is received on the susceptor and contacts the upper, outer, circumferential area of the substrate and limits access of the deposition gas to the contacted area of the substrate. However, the shadow ring has several limitations which contribute to the non-uniform processing of substrates. The volatile deposition gas still tends to migrate under the lip of the shadow ring and deposit a material layer on the substrate edge and underside which may later flake off. Additionally, the engagement of the shadow ring with the substrate can create particles. Finally, the shadow ring is a heat sink, which draws heat out of the substrate and thus reduces the temperature of the substrate adjacent the area of contact between the substrate and shadow ring, which affects the thickness of the deposition material layer on the area of the substrate adjacent the shadow ring.

One alternative to the shadow ring is disclosed in European Patent Application No. EPO 467 623 A3, published Jan. 22, 1992. In that application, a shroud is provided around the perimeter of the substrate. The shroud includes a lip which overhangs, but does not touch, the substrate. A gas is provided to the underside of the substrate, and a portion of this gas flows outwardly between the substrate and susceptor and into a gap formed between the substrate and the shroud. Although the shroud creates a circumferential channel in which a non-reactive gas may be maintained to mask the edge of the substrate, the structure shown in EPO 467 623 A3 has several disadvantages. First, when the shroud is received on the susceptor, it aligns with the susceptor and no means is disclosed for aligning the substrate with the shroud. Any substantial misalignment between the substrate and the susceptor will result in substantial misalignment between the shroud and substrate, and the resulting annular gap between the substrate and shroud will be non-uniform around the perimeter of the substrate. This will create differential masking gas flow in different locations of the substrate edge. Second, introduction of the masking gas inwardly of the outer diameter of the substrate can cause the substrate to float off the susceptor during processing if the chamber pressure and process gas flow are not closely controlled. Finally, the European application notes that the shroud disclosed therein masks the upper surface of the substrate and prevents depositions thereon, which reduces the useful area of the substrate.

A further source of substrate particulate contamination occurs where a cracked, warped or substantially misaligned substrate is present in the chamber. If a cracked, warped or substantially misaligned substrate is encountered, substantial numbers of particulate contaminants can be generated as the substrate is moved in the chamber. Additionally, if large segments of the substrate become free in the chamber, they may seriously damage the chamber components. Finally, the upper surface and passageways of the susceptor could be exposed to the corrosive reactive gas if a cracked, warped or misaligned substrate is processed in the chamber.

SUMMARY OF THE INVENTION

The present invention is useful as a CVD processing apparatus for depositing blanket and selectively deposited tungsten, tungsten silicide, titanium nitride and other deposition materials with improved uniformity and controllability. The invention includes a chamber having a substrate support member on which the substrate is located for processing. A substrate edge protection system is provided in the chamber to limit the deposition of a material layer on the edge of the substrate during processing. This edge protection system includes a ring, which is received on the substrate support member and extends over the top of the substrate adjacent the substrate edge. An alignment member is provided, to align the substrate and the ring to minimize contact between the ring and the substrate and provide a minimum gap between the edge of the substrate and adjacent areas of the ring.

BRIEF DESCRIPTION OF THE DRAWINGS

These, and other features and advantages of the invention will be apparent from the following description when read in conjunction with the accompanying drawings, wherein.

BRIEF DESCRIPTION OF THE EMBODIMENTS

Introduction

Figure 1:
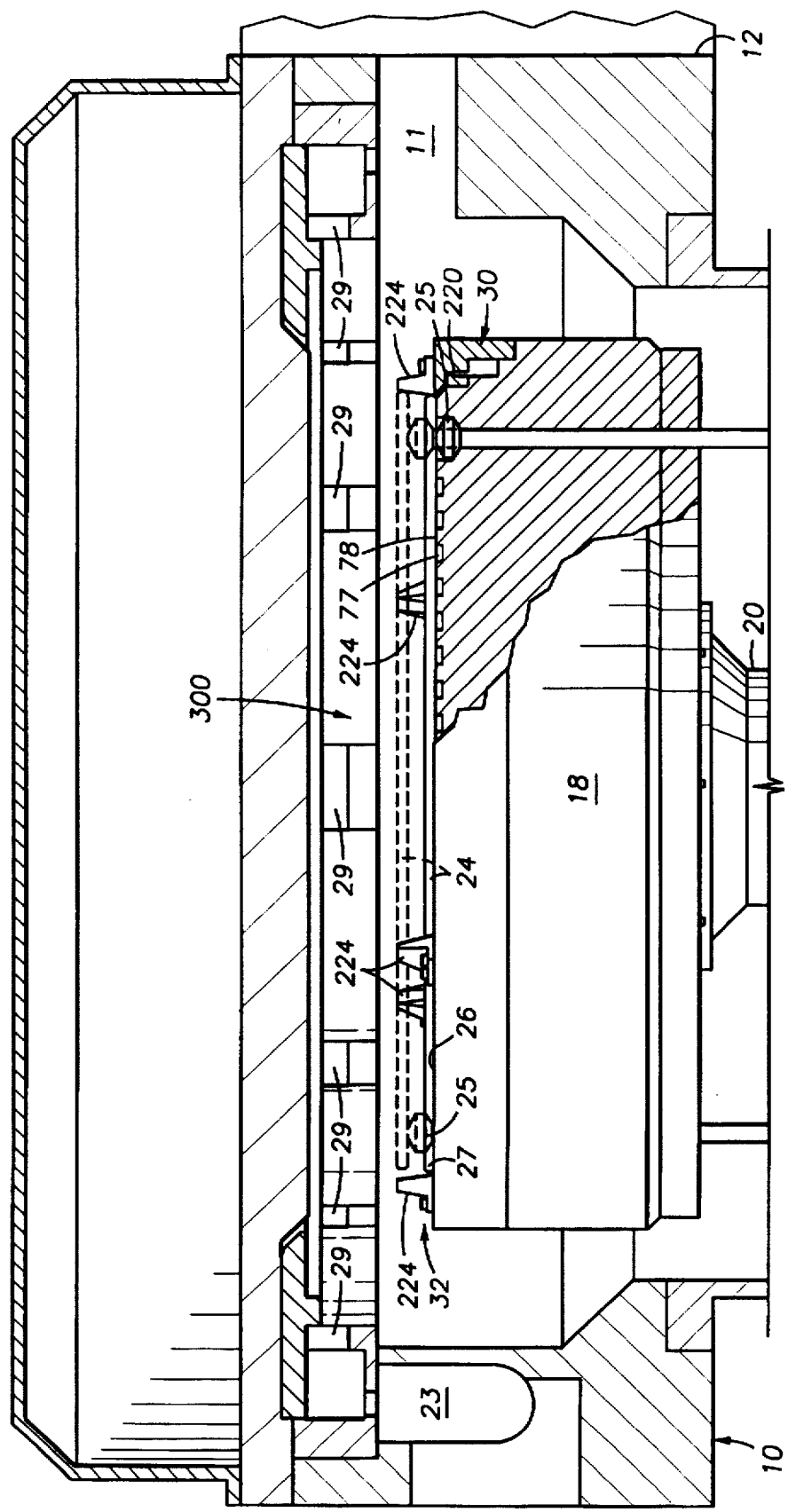
FIG. 1 is a partial sectional view of the processing chamber of the present invention, showing the receipt of a substrate on the substrate support member thereof.

The processing chamber 10 of the present invention includes multiple features and embodiments, which may be used independently, or concurrently, to provide improvements in the structure and operation of substrate processing chambers. Referring to FIG. 1, the cooperation and interaction of several of these features are shown, including an internally heated substrate support member, or heater plate 18, a substrate edge protection system 30 in the form of a purge gas channel 220, a substrate alignment member 32 in the form of a plurality of alignment pins 224 on the upper surface of the heater plate 18, and an improved chamber exhaust system 300.

The heater plate 18 is actuable upwardly within chamber 10 to receive a substrate 24 thereon for processing, and downwardly in chamber 10 to position the substrate 24 therefrom for removal from chamber 10. To position the substrate 24 on the heater plate 18, a plurality of support pins 25 are provided. These support pins 25 pass through the body of the heater plate 18 and may be extended from the heater plate 18 to receive the substrate 24 as it is placed in the chamber 10 by the robot blade. The heater plate 18 may move upwardly with respect to the support pins 25 to position the substrate 24 on the heater plate 18 for processing, and downwardly with respect to the support pins 25 to position the substrate 24 above the heater plate 18 for removal of the substrate 24 from the chamber 10 by the robot blade. For ease of illustration, support pins 25 are shown in FIG. 1 as sinking into heater plate 18. However, it will be appreciated that as the substrate 24 is being received on heater plate 18, support pins 25 and substrate 24 are stationary and heater plate 18 is actually moving upwardly.

To reduce the occurrence of the deposition layer on the substrate underside and edge, heater plate 18 includes an edge protection system 30, preferably in the form of an integral, circumferential, purge gas channel 220 positioned adjacent the edge 27 of a substrate 24 when the substrate 24 is received on the heater plate 18. Once the substrate 24 is located on heater plate 18 and processing begins, a continuous flow of purge gas is provided to channel 220 about the edge 27 of the substrate 24 to ensure that little, or no, deposition will occur on undesirable portions of the edge 27 of the substrate 24, or on the underside of the substrate 24 immediately adjacent the edge thereof. To fully exploit the purge gas channel 220, the positioning of the substrate 24 on the heater plate 18 is critical, as any gross misalignment will place a portion of the substrate 24 edge in a position which substantially blocks the channel 220. Therefore, the heater plate 18 includes a substrate alignment member 32, which includes a plurality of tapered guide pins 224 provided above channel 220 along the perimeter thereof to guide the substrate 24 onto the heater plate 18. An eccentric and/or misaligned substrate 24 will engage one or more guide pins 224 as the substrate 24 is received onto the heater plate 18. As the heater plate 18 approaches the substrate 24 supported over the heater plate 18 on support pins 25, the substrate 24 will be forced toward the center of the heater plate 18 at the portion of the substrate 24 edge 27 which touches a guide pin 224. This aligns the entire circumference of the substrate 24 in the proper position with respect to the purge gas channel 220 to ensure passage of purge gas over the entire edge 27 of the substrate 24, except in the very small area where the edge 27 contacts a pin 224.

During processing, the substrate 24 is commonly maintained at an elevated temperature. To establish and maintain this temperature, the heater plate 18 of the present invention includes a resistive heating element therein. The heater plate 18 heats the substrate 24, which commonly enters the chamber at a temperature lower than that of heater plate 18. As the substrate is heated to the processing temperature, the substrate edge 27 may load against one or more of the guide pins 224, and if significant thermal expansion occurs thereafter, the substrate edge 27 may chip. To address this problem, chamber pressure may be maintained in the plurality of vacuum grooves 77, 78 which are provided in the heater plate upper surface 26 to chuck the substrate 24 to heater plate 18 during processing. Alternatively, gas may be introduced therein to reduce the frictional adhesion of the substrate 24 to the heater plate upper surface 26 and thus allow the substrate 24 to expand away from guide pins 224 as the substrate 24 thermally expands.

To increase the uniformity of the exhaust of reacted gaseous products within the chamber 10, the exhaust manifold 23 of the chamber receives a pumping plate 308 thereover, which includes a series of spaced apertures 29 therein. The apertures 29 are evenly spaced about the entire circumference of the manifold 23, and the plate 308 spans the gap in the manifold 23 created by the presence of the slit valve 11 in the chamber wall, to increase the uniformity of the removal of reacted gaseous products from the chamber.

These features, and other additional features of the invention described herein, may be used independently or concurrently to provide improvements in the processing of substrates in the chamber.

The Processing Chamber

Figure 2:
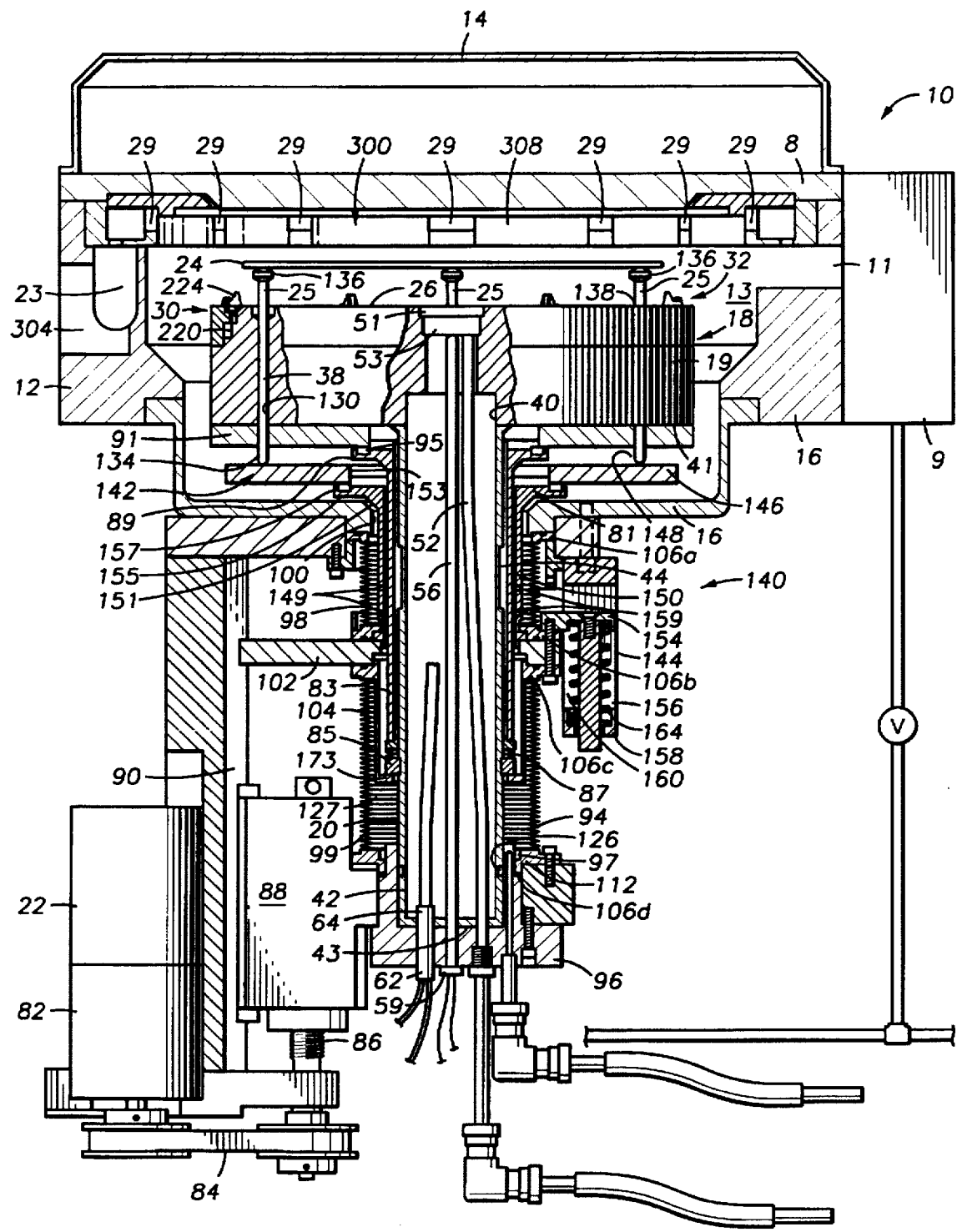
FIG. 2 is a sectional view of the processing chamber of the present invention positioned to receive a substrate therein for processing.
Figure 3:
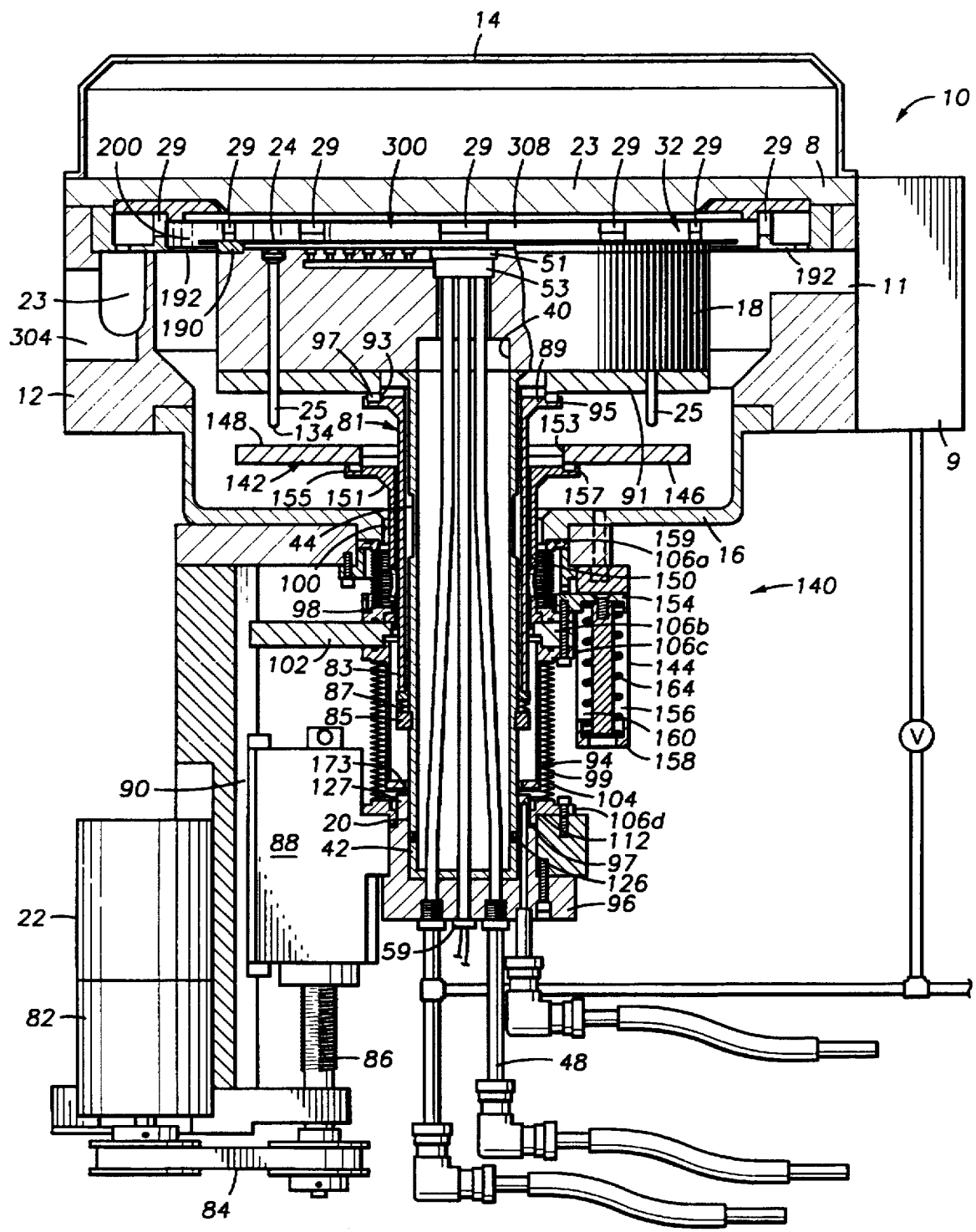
FIG. 3 is an additional sectional view of the processing chamber, including an alternative embodiment of the substrate edge protection system, positioned for processing a substrate therein.

Referring now to FIGS. 2 and 3, the multiple improvements and features of the chamber 10 of the present invention are shown in a CVD processing apparatus. In FIGS. 2 and 3, the chamber 10 is shown in partial cutaway to show the interaction and interconnection of the improvements and features of the chamber 10. In FIG. 2, the chamber 10 is shown with the heater plate 18 in the retracted position, wherein a substrate 24 may be positioned on, or removed from, the heads of the support pins 25 which extend from the upper surface of the heater plate 18. In FIG. 3, the apparatus is shown with the heater plate 18 in the extended position with the support pins 25 sunk into the heater plate 18 to position the substrate 24 on the heater plate 18 for processing. Although the features and improvements of the chamber 10 are shown in FIGS. 2 or 3, the discussion of these features may include other Figures necessary to show the details of the features and improvements.

The CVD processing apparatus of FIGS. 2 and 3 generally includes a chamber 10 having an outer wall 12, a cover 14 and a base 16 which form an evacuatable enclosure 13 in which the vertically-moveable substrate receiving heater plate 18 is located. Heater plate 18 is moveable within enclosure 13 to position a substrate 24 thereon for processing. Heater plate 18 preferably includes the substrate edge protection system 30 as an integral part thereof.

The Heater Plate and Stem Assembly

The heater plate 18 is movable vertically in the enclosure 13 by the stem 20, which is connected to the underside of heater plate 18 and extends outwardly through the base 16 of the enclosure 13 where it is connected to a drive system 22. The stem 20 is preferably a right circular, tubular, aluminum member, having an upper end 40 disposed in supporting contact with the underside of the heater plate 18 and a lower end 42 closed off with a cover plate 43. The stem lower end 42 is received in a cup shaped sleeve 96, which forms the connection of the stem 20 to the drive system 22. To provide connections from the exterior of the chamber into the heater plate 18, cover plate 43 and sleeve 96 include a plurality of aligned apertures therein, through which the heater plate connections are maintained. Stem 20 mechanically positions the heater plate 18 within the enclosure 13 and also forms an ambient passageway through which a plurality of heater plate connections extend.

The heater plate 18 is configured to provide heat to a substrate 24 received on the upper surface 26 thereof, while minimizing the heat transfer therefrom along the stem 20. The heater plate 18 is preferably a solid aluminum member, which is welded to the upper end 40 of stem 20. Preferably, the heater plate is heated by a resistive heating element located therein, to provide sufficient heat to maintain the upper surface 26 of the heater plate 18 at elevated processing temperatures of between 250 and 650 degrees celsius. The heating element is preferably a tubular member, which extends circumferentially within a groove formed in the heater plate 18, and is enclosed therein by a conforming channel which covers the groove and the heating element therein. Alternatively, the element may be cast into the plate, or otherwise provided in a sealed environment within the heater plate. Preferably, the area around the heating element is not maintained at a vacuum. To power the heating element, the element preferably includes a downwardly projecting tubular portion, which terminates in a blade type connector 64 in the cover plate 43. A mating blade connector 62 is located in the sleeve 96, to mate with, and provide electric power to, the connector 64 in the cover plate 43.

The Heater Plate Thermocouple Connection

Referring to FIG. 2, a thermocouple 56 is provided in heater plate 18 to monitor the temperature thereof. The heater plate 18 includes a bore 50, extending upwardly therein and terminating adjacent, but interiorly of, the heater plate upper surface 26. This bore 50 provides a pilot to receive the end of the thermocouple 56 therein, and also provides an aperture for the receipt of the purge gas and vacuum supplies into the heater plate 18. The bore is preferably formed by boring a through hole in the heater plate upper surface 26, and extending a plug 51 and a connector housing 53 into the bore. The upper surface of the bore 51 may be slightly recessed from the upper surface 26 of the heater plate 18, or may be ground or otherwise configured to provide a continuous heater plate upper surface 26. The connector housing 53 and the plug 51 may be formed as separate elements, or as one continuous element. The thermocouple 56 is configured as a rigid rod, which extends through a pair of aligned apertures in the cover plate 43 and the sleeve 96, and terminates within the bore 50 in contact with the solid mass of the heater plate 18 and/or the connector housing 53. The lower end of the rigid rod includes a bracket 59, which is releasably attached to the exterior of the sleeve 96, to maintain the thermocouple 56 in position in the heater plate bore 50. Preferably, the bracket is maintained on the exterior of the sleeve 96 by a plurality of screws, but other attachment means, such as clamps or spring clips, may be substituted for the screws. The thermocouple 56 is connected to an amplifier and a filter for temperature display and over-temperature protection. To ensure that air is present in the bore 50, the rigid rod may be slightly smaller in diameter than the aligned apertures in the cover plate 43 and the sleeve 96. Thus, ambient air will pass through the aligned apertures about the thermocouple 56 and thus be present about thermocouple 56 within the bore 50 in the heater plate 18 to increase the heat transfer between the mass of the heater plate 18 and the thermocouple 56 to increase the accuracy and response time of the thermocouple.

The Purge and Vacuum Supplies

Figure 6:
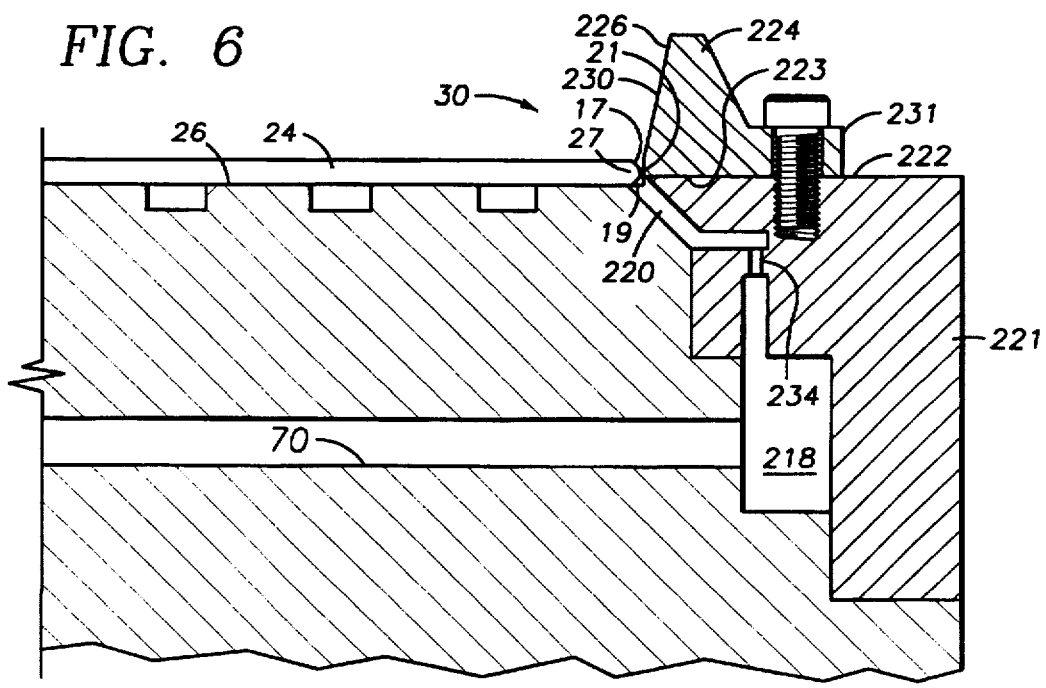
FIG. 6 is a partial, sectional view of the heater plate and substrate edge protection system of FIG. 5 at 6—6.

Referring now to FIG. 3, the purge gas supply for supplying a protective gas to the substrate edge protection system 30 is shown. Purge gas pipe 52 extends through stem 20, from cover plate 43 to the connector housing 53 in the heater plate 18. The connector housing 53 includes a plurality of bores therein, which register with purge gas and vacuum bores in the heater plate 18. A purge gas bore 70 extends within the heater plate 18, and into a corresponding bore in the connector housing 53, to supply purge gas from the connector housing 53 to the upper surface 26 of the heater plate 18. In the preferred substrate edge protection system, the bore 70 supplies purge gas to a manifold 218 which is ported to a plurality of purge gas apertures 234 extending through the upper surface of heater plate 18 into channel 220 as shown in FIG. 6.

Figure 4:
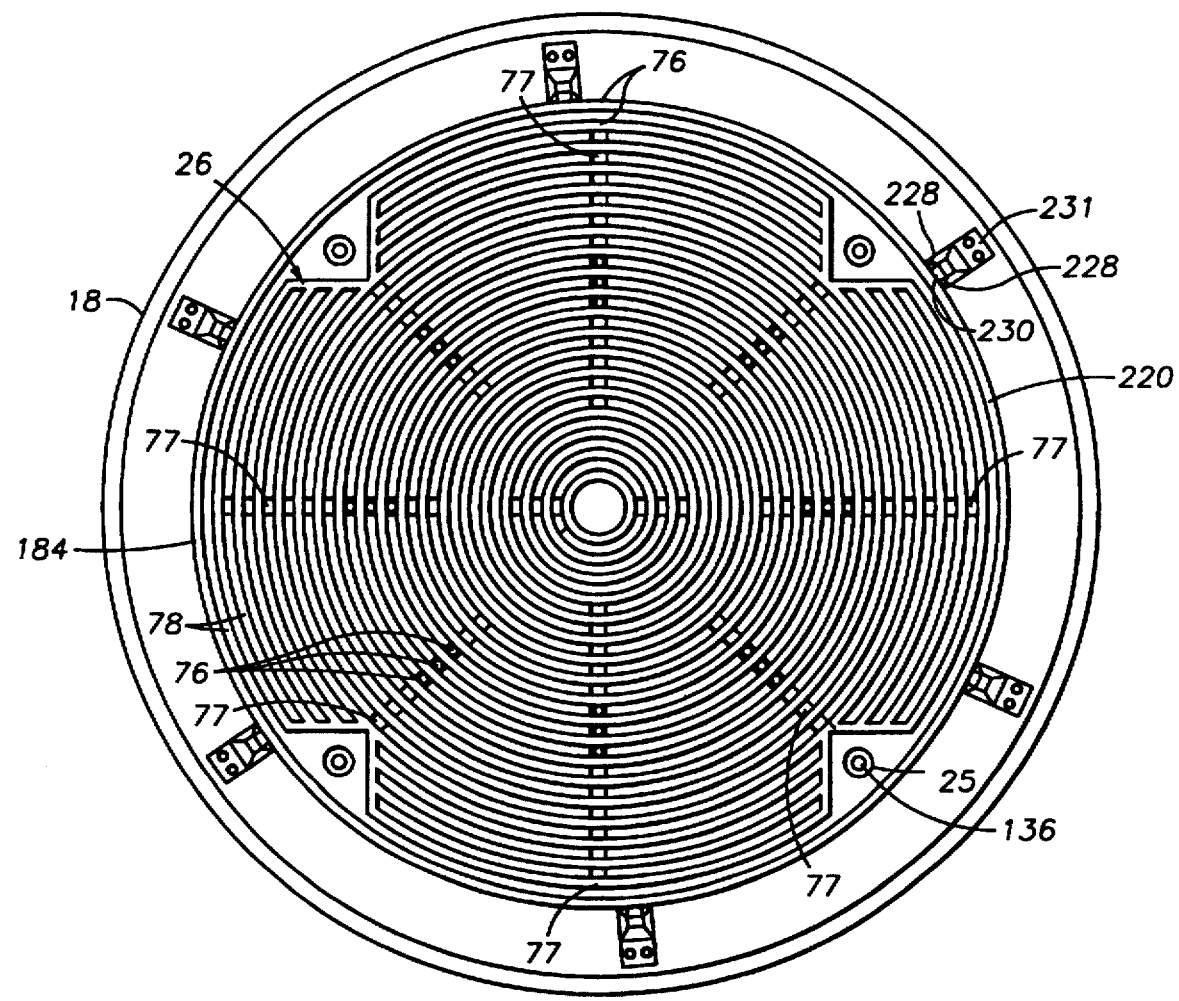
FIG. 4 is a top view of the heater plate disposed in the chamber of FIG. 2.

Referring now to FIGS. 3 and 4, the vacuum supply to heater pipe 18 is shown. Vacuum pipe 48 passes through stem 20 from the cover plate 43 on the lower distal end 42 of the stem to upper end 40 of the stem, and is connected through the connector housing 53 in the heater plate 18 to a plurality of vacuum ports 76 extending into a plurality of individual vacuum grooves 77, 78 in the upper surface 26 of heater plate 18. To supply the vacuum ports 76, a plurality of cross bores 75 are drilled into the heater plate 18 immediately below the upper surface 26, and these cross bores 75 all align into a corresponding bore in the connector housing 53. The vacuum pipe 48 terminates into the corresponding bore in the connector housing 53, and thus a vacuum is communicated through the vacuum pipe 48 and into the grooves 77, 78.

The cover plate 43 and the sleeve 96 include aligned apertures to supply the purge gas and vacuum supplies into the purge gas pipe 52 and vacuum pipe 48 in stem 20, in addition to the apertures therethrough through which the thermocouple 56 and heater element connections extend. The purge gas supply, and the vacuum, are preferably supplied to the sleeve 96 through bellows tubing, which is connected into fittings threaded into the proper apertures in sleeve 96. To prevent leakage of the vacuum or purge gas at the interface of the cover plate 43 and the sleeve 96, a circumferential groove is provided about the interface of the aligned apertures through which the vacuum and purge gas supplies are maintained. The grooves are preferably located about the exit of the apertures from the upper end of the sleeve 96, and o-ring seals are located in the grooves to seal any gap between the cover plate 43 and the sleeve 96 at the aligned apertures. The use of o-rings to seal the gas and vacuum apertures, in conjunction with the use of a blade connector 64 to connect the heating element to the power supply and the use of a rigid rod as the thermocouple, permits relatively simple disassembly of the sleeve 96 from the stem 20.

The Heater Plate Positioning Assembly

The heater plate positioning assembly 34 for positioning the heater plate at multiple locations within the chamber enclosure includes the stem 20 interconnected to the drive system 22. Stem 20 is connected to the underside of the heater plate 18, and extends outwardly of the base 16 to connect to the drive system 22. The drive system 22 includes a motor and reduction gearing assembly 82 suspended below enclosure 13 and connected with a drive belt 84 to a conformable coupling and lead screw assembly 86. A transfer housing 88 is received on lead screw assembly 86, which is guided up and down and held against rotation by a linear slide 90. Transfer housing 88 extends about the circumference of stem 20, and is attached to the lower distal end 42 thereof through the end sleeve 96, to move and support stem 20 and heater plate 18 thereon. The motor actuates the lead screw assembly 86 to move stem 20 and heater plate 18 thereon. A seal ring 126 is provided in a groove in stem 20 to seal the outer surface of the lower end 42 of stem 20 in sleeve 96.

Heater plate 18 can droop or sag along its outer edge at the high temperatures used in CVD processing. To reduce the likelihood of mechanical deformation at the high CVD process temperature, support sleeve 81 is provided to radially support heater plate 18. Sleeve 81 includes a lower tubular portion 83, preferably formed of aluminum, received on a ledge 85 on stem 20. The ledge 85 may be formed, for example, by locating a snap ring in a groove in the stem 20, which projects radially from stem 20 adjacent stem lower distal end 42 or by machining a circumferential boss on stem 20. A spring 87 is received on ledge 85 to receive the base of lower tubular portion 83 thereon to upwardly bias sleeve 81. The upper end of sleeve 81 terminates in an outwardly radiating support flange 89, on which a support ring 91, preferably a ceramic ring with high resistance to sagging at elevated temperatures, is received. The flange 89 includes an inner circular alignment boss 93 and an outer, upwardly extending lip 95. The boss 93 extends into the central aperture in ring 91 to align the ring 91 on the boss 93. The support ring 91 is supported on the lip portion 95, to minimize the contact area between the support ring 91 and the sleeve 81. Additionally, a plurality of apertures extend through lip 95, which allow gasses trapped in the interior of the sleeve 81 to vent outwardly therethrough, along the underside of the support ring 91. Support ring 91 presses against the lower ring 21 of heater plate 18, and is maintained in contact therewith by the upward bias of spring 87. The ceramic does not lose strength at the elevated processing temperature, and thus the ring 91 supports the heater plate 18 against sagging.

To protect the stem 20 and maintain a vacuum thereabout, a shroud 94 extends downwardly about stem 20 from the underside of chamber base 16 and terminates on lower end sleeve 96. Shroud 94 and the outer surface of stem 20 extending below aperture 100 form annulus 127 therebetween. The annulus 127 communicates with the interior of enclosure 13 through aperture 100, and is thus maintained at the same vacuum pressure as enclosure 13. Shroud 94 includes a pair of bellows 98, 99 and a transfer ring 102 which seals the area about the outer circumferential surface of the stem 20 from the atmosphere. Each bellows 98, 99, terminates in a support ring 106 a–d. Each support ring 106 a–d is a generally right circular member which includes an outwardly projecting support portion 112. On support rings 106 a–c, a seal ring is disposed in projecting support portion 112 to seal the annulus 127 at the support rings 106 a–c. The lower end of annulus 127 is sealed by the interconnection of sleeve 96 and transfer housing 88. Seal ring 126, disposed in stem distal end 42, seals the base of stem 20 to sleeve 96 and thus completes the sealing of annulus 127 from the atmosphere.

When a substrate is processed in chamber 10, the volatile reaction gas will migrate to the bottom of the enclosure 13, and then down through the aperture 100 and into contact with bellows 98, 99, transfer ring 102 and support rings 106 a–d. The heat generated by the electric resistance heating element to heat the heater plate 18 for substrate processing conducts through stem 20 to heat bellows 98, 99, support rings 106 a–d, drive system 22 and transfer ring 102. The heat radiated and conducted by the stem 20, in conjunction with the presence of the reactive gas, creates a corrosive environment for support rings 106 a–d, transfer ring 102 and bellows 98, 99.

Chamber Component Protection System

To reduce the heating of the stem 20 by heating element within heater plate 18, the stem 20 is manufactured from one material, preferably an aluminum alloy such as 5086 or 5083 aluminum, and the heater plate 18 is manufactured from a pure aluminum, preferably an 1100 aluminum, or other aluminum material having at least 99% Al and less than 0.05% Mg. The 1100 aluminum material may be used in the CVD environment, and need not be anodized. The aluminum material of stem 20 preferably has a smaller coefficient of thermal conductivity than the heater plate 18, and thus will transmit heat from heater plate 18 less efficiently than would a stem of a pure aluminum. Additionally, a heat choke portion 44, with a reduced cross-section and preferably 4" in length, is provided on stem 20 adjacent heater plate 18, through which a sufficient temperature gradient may be established between heater plate 18 and the lower distal end of stem 20 so that a low-cost flouroelastomer material such as a Viton® material may be used in seal 126.

To reduce the temperature of the components below the enclosure 13 which are otherwise raised by the heat which is transferred down stem 20 past heat choke portions 44, and to quickly reduce the temperature of the entire assembly when servicing is necessary, water may be provided to coolant passages provided within sleeve 96. Alternatively, a water jacket may be placed around the sleeve 96, or transfer case 88 and transfer ring 102, to help cool these components during and after substrate 24 processing. Further, a cooling fan may be used to pass air over the components to increase heat transfer therefrom.

To limit the introduction of reactive gas into annulus 127 about stem 20 and shroud 94, sleeve 96 also includes a purge gas manifold 97 formed at the interface of the sleeve 96 and the lower support ring 106d, into which a supply of purge gas, such as Argon, may be provided. The purge gas flows outwardly from the manifold 97, from a plurality of holes spaced about the manifold 97, preferably 8 to 12 holes, and then upwardly through annulus 127, to maintain a gas barrier against entry of reactive gasses through aperture 100 into annulus 127. The flow of purge gas through the manifold 97 is preferably maintained at a flow rate which will maintain laminar plug flow of purge gas upwardly in the annulus 127. By maintaining these conditions, the diffusion of the reactive gas downwardly through the aperture 100 will be substantially eliminated. Additionally, during processing, the purge gas passes up through aperture 100 and about the outer edge of the heater plate 18 to minimize the passage of reactive gas down about the sides of heater plate 18. This reduces the amount of reactive gas which reaches the interior surfaces of the structural components of the chamber, and the underside of the heater plate 18, to reduce the amount of unwanted material deposition which may occur on these surfaces.

The Substrate Positioning Assembly

Stem 20 moves upwardly and downwardly through the aperture 100 in base 16 of enclosure 13, to move heater plate 18 to receive a substrate 24 thereon and, after processing, to move heater plate 18 into a position where the substrate 24 may be removed from the enclosure 13 by a robot blade. To selectively support the substrate 24 in a position above the heater plate 18, the substrate positioning assembly 140 includes a plurality of support pins 25 which move with respect to heater plate 18 to support the substrate 24 in position to be placed in, or removed from, the enclosure 13, and to locate the substrate 24 on the heater plate 18. The support pins 25 are received in sleeves in bores 130 disposed vertically through heater plate 18. Each pin 25 includes a cylindrical shaft 132 terminating in a lower spherical portion 134 and an upper truncated conical head 136 formed as an outward extension of shaft 132. Bore 130 includes an upper, countersunk portion 138 sized to receive enlarged head 136 therein such that when pin 25 is fully received into heater plate 18, head 136 does not extend above the surface of heater plate 18.

Referring now to FIGS. 2 and 3, support pins 25 move partially in conjunction with, and partially independently of, heater plate 18 as heater plate 18 moves within enclosure 13. Support pins 25 must extend from heater plate 18 to allow the robot blade to remove the substrate 24 from the enclosure 13, but must also sink into heater plate 18 to locate the substrate 24 on the upper surface 26 of heater plate 18 for processing. To provide this positioning, a substrate positioning assembly 140 is provided which is normally biased upwardly into enclosure 13, but is also moveable downwardly by the stem 20 as stem 20 moves to actuate heater plate 18 downwardly in enclosure 13.

Substrate positioning assembly 140 includes an annular pin support 142 which is configured to engage lower spherical portions 134 of support pins 25, and a drive member 144 which positions pin support 142 to selectively engage support pins 25 depending upon the position of heater plate 18 within chamber. Pin support 142 includes an upper pin support ring 146, preferably made from ceramic, which extends around the underside of heater plate 18 to selectively engage the lower spherical portions 134 of support pins 25, and a sleeve portion 150 which extends downwardly from pin support ring 146 through aperture 100 to terminate on transfer ring 102. Transfer ring 102 is disposed circumferentially about stem 20, and is keyed to slide 90 to prevent rotation thereof.

The sleeve portion 150 includes a lower cylindrical portion 149, and an outwardly extending radial support 151 which receives and supports pin support 146 thereon. The radial support 151 includes an upper, generally flat, upper surface having a circumferential alignment wall 153 which aligns with the inner diameter of the annular pin support 146 and a plurality of upwardly supporting support ribs 155 which support the underside of the pin support ring 146. During the operation of the chamber 10, gases may become trapped along the interior of cylindrical portion 149, which could damage the chamber components. To relieve these gases, a plurality of gaps 157 are formed adjacent the support ribs 155, and a plurality of holes 159 are formed through lower cylindrical portion 149. The holes 159 and gaps 157 allow the free flow of gases from the interior to the exterior of the sleeve 150.

Pin drive member 144 is located on the underside of enclosure 13 to control the movement of sleeve portion 150 with respect to heater plate 18, and includes therefore a spring assembly 156 which is connected to transfer ring 102 to provide the upward bias on transfer ring 102 and sleeve portion 150 to bias pin support ring 146 upwardly to push the support pins 25 upwardly through the heater plate 18, and the snap ring or ledge 84 on stem 20 which is selectively engageable with sleeve 150 to move sleeve portion 150 and pin support ring 146 attached thereto downwardly after heater plate 18 has moved a preselected distance downwardly in enclosure 13. Spring assembly 156 includes a housing 158 having a slot 160 therethrough, which is attached to the underside of enclosure 13 adjacent aperture 100. A spring-loaded finger 154 extends through slot 160, and is upwardly biased by a spring 164 in housing 158. Finger 154 is rigidly connected to transfer ring 102, and thus upwardly biases sleeve 150 attached thereto. The upper terminus of housing 158 limits the upward movement of finger 154. Transfer ring 102 is also rigidly connected to support ring 106c, which includes a downwardly extending tubular portion which terminates in an inwardly extending flange 173. The ledge 85, which supports sleeve 81 on stem 20, is also engageable against flange 173 as stem 20 moves downwardly.

When heater plate 18 is fully upwardly extended in enclosure 13 for processing, finger 154 is fully actuated against the upper end of housing 158, and pin support ring 146 is disposed below heater plate 18 such that the lower spherical portions 134 of support pins 25 are spaced therefrom. When processing is completed, stem 20 moves downwardly to move heater plate 18 downwardly in enclosure 13. As this movement continues, lower spherical portions 134 of pins engage pin support ring 146. At this point, finger 154 is biased against the top of housing 158 and both the finger 154 and the pin support ring 146 coupled thereto remain stationary. Thus, once lower spherical portions 134 engage pin support ring 146, support pins 25 remain stationary and support the substrate 24 in a stationary position within chamber as heater plate 18 continues moving downwardly. After a preselected amount of heater plate 18 travel, the ledge 85 on stem 20 engages flange 173, which locks stem 20 to sleeve 150 and causes heater plate 18 and pin support ring 146 to move downwardly in unison. Once the ledge 85 engages flange 173, the support pins 25 remain stationary with respect to heater plate 18, and both elements move downwardly in enclosure 13. Once heater plate 18 and substrate 24 suspended thereover on support pins 25 are in the proper position, the robot blade enters through the slit valve 11, removes the substrate 24, and places a new substrate 24 on support pins 25. Stem 20 then moves to move sleeve 150 and heater plate 18 upwardly. When finger 154 engages the top of housing 158 sleeve 150 becomes stationary, while ledge 85 moves off flange 173 as stem 20 continues moving upwardly, and thus continued movement of heater plate 18 sinks support pins 25 therein to position the substrate 24 thereon for processing. By moving the support pins 25 partially in conjunction with, and partially independently of, the heater plate 18, the overall length of the support pins 25 may be minimized, and the length of the pin shaft 132 which is exposed below the heater plate 18 and support ring 91 during processing is equal to the distance from the heater plate 18 that the substrate 24 is located when the substrate 24 is being manipulated on and off the support pins 25 by the robot blade. Thus, minimal support pin 25 surface area is exposed during processing, and therefore minimal deposits will occur on the support pins 25.

The Vacuum Clamping System

Referring now to FIGS. 2 and 4, the vacuum clamping mechanism of the present invention is shown. The upper surface 26 of heater plate 18 includes a plurality of concentric grooves 78 therein, which intersect with a plurality of radial grooves 77. A plurality of vacuum ports 76, preferably three per radial groove 77, are disposed to communicate between the base of each radial groove 77 and the circular vacuum manifold 75 disposed within heater plate 18. Vacuum pipe 48 communicates with manifold 75 to supply the vacuum thereto.

Vacuum ports 76 and grooves 77, 78 provide a low pressure environment under the substrate 24 to chuck the substrate 24 to the heater plate upper portion 26. During processing, enclosure 13 may be maintained at about 80 torr. To adhere the substrate to heater plate top surface 26 during processing, a vacuum of 1.5 torr to 60 torr is drawn through vacuum pipe 48, and thus through ports 76 to grooves 77, 78. The 20 to 78 torr pressure differential between grooves 77, 78 and enclosure 13 causes the substrate 24 to adhere to the heater plate top surface 26 to increase the heat transfer from the heater plate 18 to the substrate 24. After processing, grooves 77, 78 may maintain a lower pressure than that present in enclosure 13, which may firmly adhere the substrate 24 to heater plate upper surface 26. In that instance, support pins 25 can crack the substrate as it is forced off the heater plate 18. To equalize the pressure existing in grooves 77, 78 with that existing in enclosure 13, a bypass line may be provided between the vacuum pipe 48 inlet and the chamber slit valve 11. When the heater plate is actuated to remove the substrate 24 from the chamber 10, the bypass line is opened to communicate between the grooves 77, 78 and the enclosure 13. Heater plate top surface 26 may also include a groove, or plurality of grooves, located adjacent the outer circumference thereof which are not connected to the vacuum. These grooves reduce the area of contact between the substrate 24 and heater plate 18, which reduces the heat transfer to, and thus deposited film thickness on, the substrate edge 27.

During sequential processing of substrates, it has been found that substrates 24 may become sufficiently misaligned, with respect to the chamber components, that the substrate 24 may be tipped with respect to heater plate upper surface 26. Additionally, substrates 24 may be cracked or warped. In each instance, the continued processing of the substrate 24 can allow the processing gas to contact the internal areas of the heater plate 18 which can effect the integrity of the heater plate 18, can create particles, or can free portions of the cracked substrates into the chamber. In these instances, it is desirable to immediately stop the processing to remove the substrate 24 before chamber damage occurs. It has been found that in the situation where a substrate 24 is misaligned, cracked or warped, the vacuum pressure at the inlet to the vacuum pump, which maintains the vacuum pressure in grooves 77, 78 in the heater plate 18, will change from that which is present when a flat, complete and properly positioned substrate is on the heater plate 18. A pressure sensor 49 is located in the vacuum line at the inlet to the vacuum pump to transmit a signal to a shut down controller, which shuts down chamber operation when the vacuum pressure is indicative of a cracked, warped or misaligned substrate. When a substrate 24 is properly received on the heater plate 18, and the enclosure is maintained at about 80 torr, the pressure at the vacuum pump inlet, and thus at the sensor 49, will be 1 to 2 torr. Where a substrate 24 which is substantially misaligned, cocked or substantially warped is received on the upper surface 26, the sensor 49 pressure will approach less than 5 torr. With a cracked substrate, the pressure will range from 10 torr up to the chamber pressure.

The Substrate Edge Protection System

Figure 5:
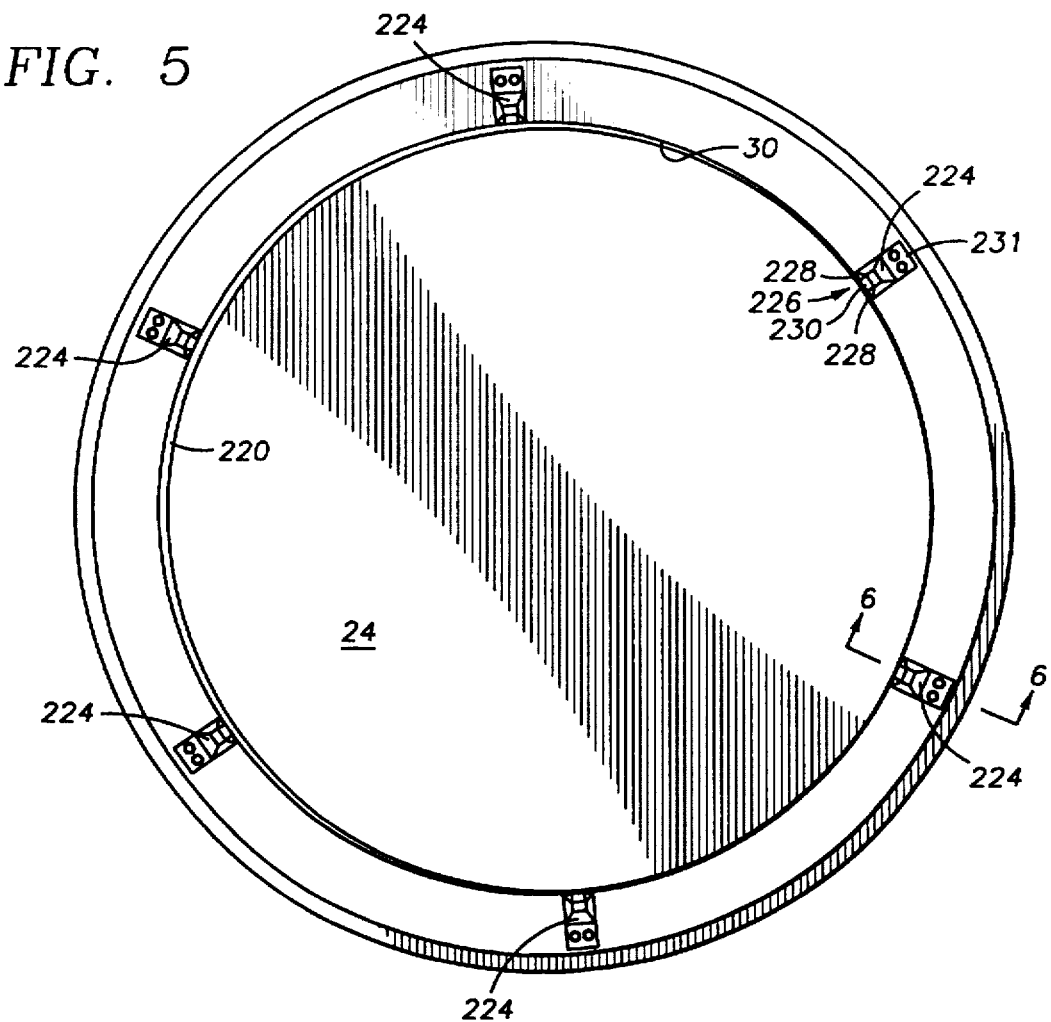
FIG. 5 is an additional top view of the heater plate of FIG. 5 having a substrate thereon.

Referring now to FIGS. 5 and 6, the preferred embodiment of the substrate edge protection system 30 is shown. When a substrate is located on the upper surface 26 of heater plate 18, the substrate edge protection system 30 provides a gas which passes about the perimeter of the substrate 24 to prevent material deposits on that area of the substrate 24. Substrate 24 has a circumferential edge 27 extending around the periphery thereof, which includes an upper tapered surface 17, a lower tapered surface 19 and a generally flat middle circumferential portion 21. To limit the occurrence of substrate 24 defects caused by the dislodging of loose deposits on the edge 27 and underside of the substrate 24, but simultaneously maximize the number of useful die produced from the substrate 24, the deposition layer should be evenly deposited all the way to the edge 27 of the substrate, but not occur on the underside, lower tapered surface 19 or flat middle portion 21 of the substrate 24 where it may contact other materials and become dislodged. The substrate edge protection system 30 of the present invention addresses this requirement.

Referring to FIG. 6, the upper surface 26 of heater plate 18 is configured to provide an integral purge gas channel 220 to supply a relatively constant supply of purge gas about the entire perimeter of substrate 24. To provide purge gas channel 220, heater plate upper surface 26 terminates in an upwardly projecting guide receiving portion 222 which is an annular flat raised portion, disposed 0.002 to 0.005 inches above upper surface 26. Purge gas channel 220 is formed as an inwardly extending groove, disposed at an approximately 135° angle from upper surface 26, at the interface of upper surface 26 and the base of the inner edge of guide receiving portion 222. A plurality of purge gas holes 234 are disposed between the inner terminus of purge gas channel 220 and the purge gas manifold 218, and are evenly spaced circumferentially about the heater plate 18 to supply the purge gas from manifold 218 into channel 220. The number of holes 234 is dependent upon the intended distance between the substrate edge 27 and the bottom of the channel 220. With a distance from the point of entry of the hole 234 into the channel 220 to the substrate edge 27 of 0.060 inches, the number of holes is approximately two hundred and forty. As the distance from the hole 234 opening to the wafer edge 27 increases, the number of holes necessary to provide a constant flow of purge gas at substrate edge 27 decreases. Where the distance from the opening of hole 234 to the substrate edge 27 is doubled, the number of holes 234 is approximately halved.

Referring again to FIGS. 5 and 6, to precisely position the substrate edge 27 adjacent channel 220 for processing, the preferred substrate alignment member 32 includes a plurality of ceramic guide pins 224 disposed on guide receiving portion 222 adjacent channel 220. Each pin 224 includes a front portion 226 tapered approximately 12 degrees from vertical. Front portion 226 includes a generally flat extending central portion 230, and tapered sides 228, such that central portion 230 extends further inward heater plate upper surface 26 than tapered sides 228. Central portion 230 extends inwardly from guide receiving portion 222 and over purge gas channel 220. Each pin 224 also includes a rearwardly extending mounting tab 231, which includes a pair of holes therein for receipt of bolts to secure the pin 224 to guide receiving portion 222.

The guide pins 224 are located on heater plate 18 such that extending central portions 230 of the pins 224 are disposed approximately five to seven thousandths of an inch from substrate flat middle circumferential portion 21 when substrate 24 is perfectly aligned to the center of heater plate 18. Thus, in the instance where the substrate 24 is perfectly aligned, the substrate 24 will come into contact with upper surface 26 without touching any of pins 224. However, most substrates have a slight amount of eccentricity, and the robot blade does not always perfectly center the substrate 24 on upper surface 26. In those instances, lower tapered surface 19 and flat middle circumferential portion 21 of substrate 24 will engage one, or more, extending portions 230 of guide pins 224, and the guide pins 224 will align the substrate into position on upper surface 26 so that edge 27 does not substantially block purge gas channel 220. By positioning the substrate 24 with guide pins 224, the only portion of the substrate 24 which touches the alignment mechanism is that small portion of edge 27 in contact with guide pin central portion 230. As central portion 230 extends radially inwardly from purge gas channel 220, substrate edge 27 will locate a small distance from the channel 222, and the area of substrate 24 to each side of the contact area of substrate 24 with central portion 230 will receive an uninterrupted supply of purge gas. Although in the preferred embodiment a purge gas is supplied to the substrate edge, the present invention specifically contemplates the use of reactive gasses, in addition to the purge gas, as the masking gas. By adding a reactive species, such as $H_2$ to the purge gas, deposition at the substrate edge may be selectively enhanced if desired.

When the substrate 24 is first received on heater plate 18, the temperature thereof may be substantially lower than the heater plate 18 temperature. Once the substrate 24 comes into contact with the heater plate 18, heat is transferred into the substrate 24 to raise its temperature to the processing temperature. This temperature increase causes thermal expansion of the substrate 24, such that edge 27 thereof may press against alignment pins 224. Further, the vacuum in grooves 77, 78 firmly adheres the substrate 24 to heater plate 18 upper surface 26, such that the edge 27 of substrate 24 may become compressively loaded against pin 224. As a result of this loading, the substrate 24 can crack or chip where it touches alignment pin 224. To minimize the occurrence of chipping or cracking at the substrate edge 27, the chamber controller may be programmed to maintain the chamber pressure in the vacuum grooves 77, 78 during the period when the substrate 24 is heated, and then pull a vacuum through the grooves 77, 78 after the substrate 24 reaches a stable temperature. The presence of chamber pressure below substrate 24 allows the substrate to expand away from the area of contact with alignment pin 224, thus reducing localized compressive stresses and reducing the incidence of compressive cracking or chipping on the substrate edge 27. Additionally, purge gas may be backflushed through vacuum grooves 77, 78 as the substrate 24 is received on upper surface 26 to help align the substrate 24 and reduce frictional adhesion of the substrate 24 to support pins 25 as guide pins 224 guide the substrate 24 into position, or gas may be backflushed through the grooves 77, 78 as the substrate 24 thermally expands to allow the substrate 24 to expand away from pins 224 when received on heater plate upper surface 26.

The Alternative Substrate Edge Protection System

Figure 7:
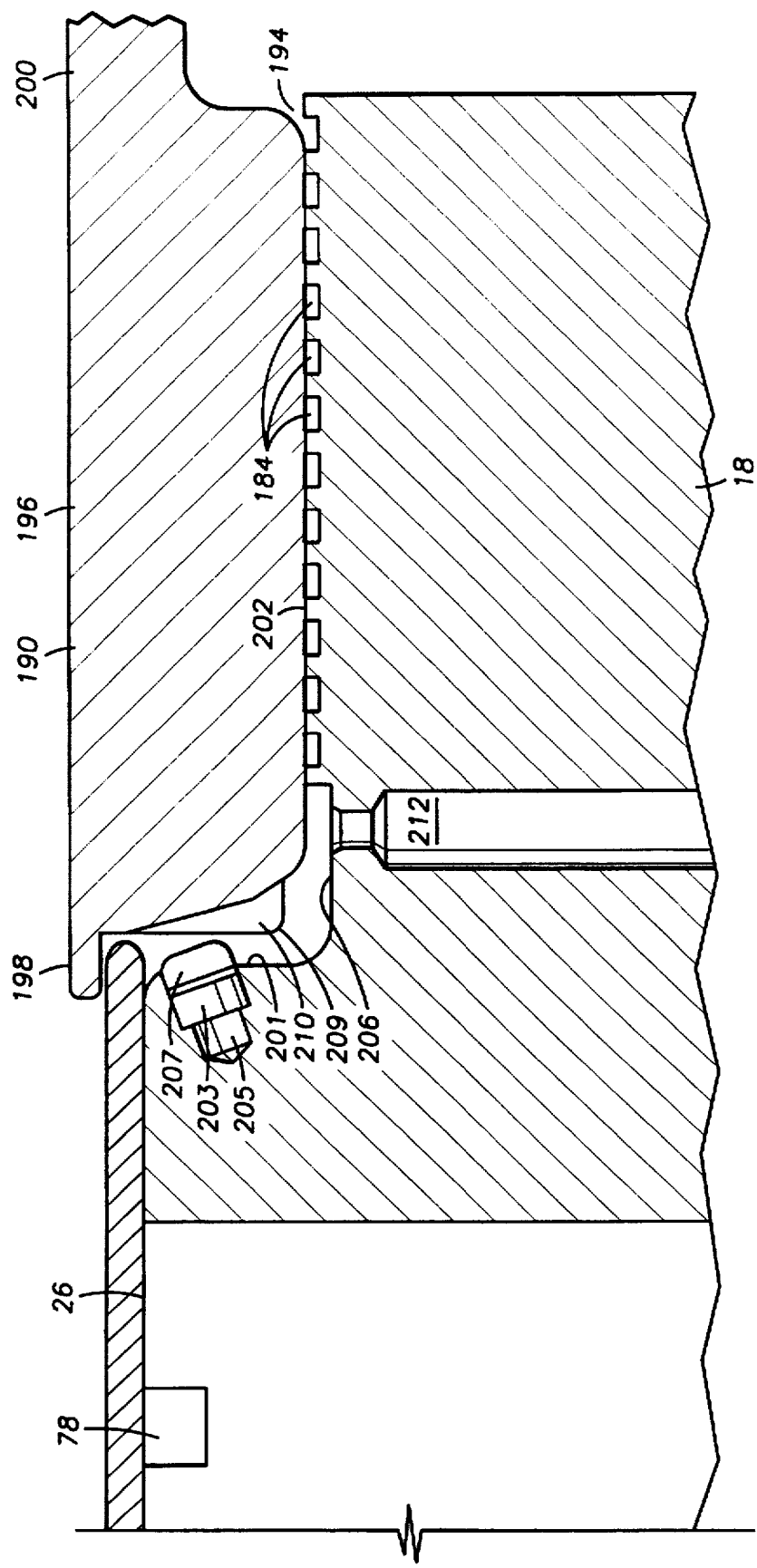
FIG. 7 is a partial, sectional view of the heater plate of FIG. 4 showing the details of an alternative substrate edge protection system.

Referring now to FIG. 3 and primarily FIG. 7, an alternative embodiment of the substrate edge protection system 30 of the present invention is shown. The alternative embodiment of the edge protection system 30 includes a ring 190, preferably fabricated from alumina or AlN, suspended in enclosure 13 over heater plate 18 on ring guide 192 for selective engagement on heater plate 18 (FIG. 3). When heater plate 18 is actuated upwardly in enclosure 13, it passes through a ring guide 192 in enclosure 13 to receive ring 190 thereon. Heater plate 18 includes a ring ledge 194 about its outer circumference, upon which ring 190 is received. Ring 190 includes annular body portion 196 having a radially inwardly projecting shield portion 198 formed as a thin extension of body 196, and projecting support lip 200 which extends from the outer circumference thereof to be received on ring guide 192. When received on heater plate 18, shield portion 198 overhangs, but does not touch, the top of the substrate 24.

Ring ledge 194 in heater plate 18 forms an outer, annular depression which includes an annular flat portion 202 extending radially outwardly below the upper surface 26 of heater plate 18 along the outer edge thereof, having a plurality of circumferential grooves 184 therein. Grooves 184 reduce the contact area between ring body 196 and heater plate 18, and thus reduce the incidence of particle generation which may occur when the ring 190 is received on the heater plate 18 or as annular depression 194 and ring 190 differentially expand or contract from variations in temperature in heater plate 18 or ring 190. Flat portion 202 terminates at the interface thereof with the top surface 26 of heater plate 18 in a ported purge gas channel 206. Purge gas channel 206 is disposed circumferentially about heater plate 18, and forms a purge gas chamber 210 in conjunction with the inner edge of body 196, the underside of shield portion 198, the outer edge 27 of the substrate 24, and the inner edge 201 of the annular depression extending between the heater top surface 26 and annular depression 194. A plurality of purge gas bores 212 extend into purge gas chamber 210, and are connected within heater plate 18 to bore 70, which is fed by purge gas pipe 52 extending through stem 20 into heater plate 18, to supply a purge gas, such as argon, into purge gas chamber 210 around the circumference of the substrate 24.

As the heater plate 18 moves upwardly in enclosure 13 to receive purge ring 190, misalignment between heater plate 18 and ring 190 may be present. This misalignment, if left unaddressed, could allow the inner edge of the ring 190 below shield portion 198 to engage against the edge 201 of ledge 194 and generate contaminating particles. To address this problem, a plurality of guide bumpers 203 are provided in edge 201, and the bumpers extend outwardly from edge 201 to provide a specific location for engagement of ring 190 on heater 18 when gross misalignment between ring 190 and heater plate 18 is present. Each bumper 203 includes a stud portion 205 received in the wall of edge 201, and a generally spherical head portion 207 which forms the portion of bumper which engages the ring 190. Head portion 207 and ring 190 are preferably manufactured from the same material, such as an alumina based material. Additionally, the spherical head 207 of bumper 203 allows for point contact of the edge of ring 190 against bumper 203, and thus reduces the contact area of the bumper 203 and ring 190 from which potential contaminating particles may be produced in the instance where contact occurs.

The receipt of the ring 190 on the substrate 24 may also be misaligned. To address this misalignment, the alternative substrate alignment member 32 includes a plurality of webs 209 (only one shown) provided at the edge of the ring 190 below shield portion 198 about the circumference thereof, to engage the outer edge of substrate 24. Webs 209 are chamfered from the bottom, to top, of the ring 190, and thus will engage the outer edge of substrate 24 as the heater plate 18 pushes the substrate 24 up through the ring 190. Where the substrate 24 and the ring are sufficiently misaligned, the webs move the substrate 24 with respect to the ring 190 to center the substrate 24 within the ring 190. Again, a purge gas may be passed upwardly through vacuum grooves 77, 78, or the chamber pressure may be maintained therein, to reduce the frictional resistance between the substrate 24 and the heater plate upper surface 26 to facilitate substrate 24 alignment.

The gap between the top of the substrate 24, and the underside of lip 192, is on the order of less than one up to 15 thousandths of an inch. Additionally, the distance from the side of the ring 190 adjacent web 209 to the edge of the substrate, may be on the order of 2 to 5 thousandths of an inch. Argon or other purge gas is supplied through bores 212 to maintain the pressure in purge gas chamber 210 above the ambient pressure within enclosure 13, and thus a relatively constant flow of purge gas may be maintained past the upper edge of the substrate 24 during processing to limit access of the reactive gas to the edge 27 of the substrate 24. The webs, 209 align the substrate 24 and ring 190, to maintain a nominal gap between the inner face of the ring 190 and the edge 27 of substrate 24 of 42 to 45 mils over the entire inside circumference of the ring 190, except where web 209 touches substrate 24. This ensures a sufficiently continuous, even, flow of the purge gas exiting from the bores 212 through the gap between the substrate 24 and overhanging shield portion 198. The consistency of the flow area about the circumference is critical, because any significant localized restriction in the flow of purge gas, which would be caused by a misalignment of the substrate 24, heater plate 18 and ring 190, would result in an uneven flow through the gap between the shield portion 198 and substrate 24 to create a non-uniform deposition layer around the substrate 24 edge. Although the purge ring 190 is configured to minimize substrate edge variation, the masking of the top of the substrate 24 at the edge 27 thereof by the ring 190, in combination with the non-reactive purge gas, limits the amount of reactive gas which reaches the masked portion and thus the deposition layer thereon may still be thinner than that deposited on the unmasked portion of the substrate 24. It has been found that the introduction of a reactive gas such as $H_2$, with the inert gas such as argon, will enhance the deposition on substrate 24 near the masked portion of the substrate 24, and thus result in a layer near or adjacent the masked portion substantially the same as that deposited on the remainder of substrate 24. The $H_2$ may be introduced into purge gas pipe 52 for introduction through bores 212 to enhance the deposition layer near the masked portion of the substrate 24.

The Chamber Exhaust System

Referring again to FIGS. 2 and 3, the improved exhaust system 300 of the present invention is shown. The top 12 of chamber 10 includes a prior art manifold 23 which leads to the exhaust port 304 of the chamber 40. Suction through the exhaust port 304 pulls exhausted chamber gasses out of enclosure 13 to maintain the proper processing environment in enclosure 13. Manifold 23 extends substantially around the perimeter of top 14, but a gap remains where wall 16 is pierced by the slit valve 11. This gap creates uneven exhausting and thus uneven chamber processing gas distribution throughout the enclosure 11. In accordance with the invention, a pumping plate 308, with a plurality of apertures 29 evenly spaced thereabout, is mounted over manifold 23. Apertures 29 are spaced apart approximately 30 degrees, and an aperture 29 is spaced at each end of manifold 23 adjacent the gap. The evenly spaced apertures in pumping plate 308 create even exhausting of used chamber processing materials, which leads to the creation of a more uniform deposition layer on the substrate 24.

Conclusion

The foregoing embodiments of the invention provide a CVD chamber which yields a more uniform deposition material layer on the substrate, while simultaneously reducing the incidence of particle generation during processing. By eliminating the shadow ring which touches the substrate during processing, and instead creating a uniform sheath of purge gas about the substrate edge during processing, the overall yield of die from the substrates is increased by reducing localized temperature variation at the substrate edge and eliminating the masked edge of the substrate created by the shadow ring. Additionally, the uniformity of the deposition is enhanced, by creating a uniform exhausting of reacted products from the enclosure 13.

The structure of the improved CVD chamber also leads to reduced particle generation. Rubbing of the substrate 24 on heater plate 18 upper surface 26 is reduced, by reducing the frictional adhesion of the substrate 24 and heater plate 18 as the substrate is received thereon, by eliminating contact between the shadow ring and substrate 24, and by reducing the amount of deposition material received on the chamber components.

Although specific materials have been described for use with the present invention, those skilled in the art will recognize that the materials, and the arrangement of the components of the invention, may be changed without deviating from the scope of the invention. Additionally, although the invention has been described for use in a CVD chamber, the components herein are equally suited for use in plasma deposition and other processes.

We claim:

1. An apparatus for protecting an edge of a substrate from a processing gas within a processing chamber, comprising:
   a substrate support member having a substrate receiving surface to receive the substrate thereon;
   a purge fluid passage positioned adjacent the substrate receiving surface to deliver a purge fluid to the edge of the substrate when received on the substrate receiving surface;
   a purge fluid guide ring movably receivable on said substrate support member, wherein said purge fluid guide ring forms a purge fluid gap in fluid communication with the purge fluid passage and wherein said purge fluid guide ring includes a projecting shield portion extending inward over the peripheral edge of the substrate when received on the substrate receiving surface to provide a fixed gap between the substrate and said shield portion; and
   at least one substrate alignment member positioned to align the substrate so that the edge of the substrate is adjacent the purge fluid passage.

2. The apparatus of claim 1, wherein the purge fluid passage is an annular channel extending from an edge of the substrate receiving surface through the support member at an angle of about 135°.

3. The apparatus of claim 1, further including a minimum gap between the edge of the substrate when received on the substrate receiving surface and said purge fluid guide ring when the guide ring is received on said substrate support member.

4. The apparatus of claim 3, wherein a mixture of purge fluid and enhancement gas is flowed through the minimum gap.

5. A method of protecting an edge of at substrate from a processing gas within a processing chamber, comprising:
   providing a substrate support member having a substrate receiving surface thereon;
   providing a purge fluid passage positioned adjacent the substrate receiving surface to deliver a purge fluid to the edge of the substrate when received on the substrate receiving surface;
   locating a substrate on the substrate support member;
   aligning the substrate on the substrate support member so that the edge of the substrate is adjacent the purge fluid passage;
   aligning a guide ring on the substrate support member to form a purge fluid gap in fluid communication with the purge fluid passage, wherein the substrate support member includes a guide bumper thereon engageable with the guide ring to align the guide ring on the substrate support member; and
   delivering a purge fluid through the purge fluid passage to the edge of the substrate on the substrate receiving surface.

6. The method of claim 5, wherein the guide bumper includes a spherical head.

7. An apparatus for protecting the edge of a substrate from a processing environment maintained within a processing chamber, comprising:
   a substrate support member disposed in said chamber to receive a substrate thereon;
   a substrate alignment member positioned to align the substrate with the substrate support member;
   a guide ring selectively receivable on said substrate support member;
   at least one guide bumper disposed on said substrate support member and engageable with said guide ring to align said guide ring on said substrate support member; and
   wherein said substrate support member includes a substrate receiving portion, an annular ledge disposed circumferentially about said substrate support member and a circumferential recess interconnecting said annular ledge and said substrate receiving portion, and said guide bumper is disposed in said recess.

8. The apparatus of claim 7, wherein said guide bumper includes a spherical head engageable with said guide ring.

9. The apparatus of claim 8, wherein said spherical head and said guide ring are constructed of the same materials.

10. An apparatus for protecting an edge of a substrate from a processing gas within a processing chamber, comprising:
    a substrate support member having a substrate receiving surface to receive the substrate thereon;
    a purge fluid passage positioned adjacent the substrate receiving surface to deliver a purge fluid to the edge of the substrate when received on the substrate receiving surface;
    a purge fluid guide ring movably receivable on said substrate support member, wherein said purge fluid guide ring forms a purge fluid gap in fluid communication with the purge fluid passage; and
    at least one substrate alignment member positioned to align the substrate so that the edge of the substrate is adjacent the purge fluid passage, wherein said alignment member includes at least one alignment web on said purge fluid guide ring positioned to selectively engage the edge of the substrate received on said substrate support member.

11. An apparatus for protecting an edge of a substrate from a processing gas within a processing chamber, comprising:
    a substrate support member having a substrate receiving surface to receive the substrate thereon;
    a purge fluid passage positioned adjacent the substrate receiving surface to deliver a purge fluid to the edge of the substrate when received on the substrate receiving surface;
    a purge fluid guide ring movably receivable on said substrate support member, wherein said purge fluid guide ring forms a purge fluid gap in fluid communication with the purge fluid passage;

at least one substrate alignment member positioned to align the substrate so that the edge of the substrate is adjacent the purge fluid passage; and at least one guide bumper disposed on said substrate support member and engageable with said guide ring to align said guide ring on said substrate support member.

12. An apparatus for protecting an edge of a substrate from a processing gas within a processing chamber, comprising:

a substrate support member having a substrate receiving surface to receive the substrate thereon;

a purge fluid passage positioned adjacent the substrate receiving surface to deliver a purge fluid to the edge of the substrate when received on the substrate receiving surface, wherein the purge fluid passage is an annular channel extending from an edge of the substrate receiving surface through the support member at an angle of about 135°; and at least one substrate alignment member positioned to align the substrate so that the edge of the substrate is adjacent the purge fluid passage.

13. A method of protecting an edge of a substrate from a processing gas within a processing chamber, comprising:

providing a substrate support member having a substrate receiving surface thereon;

providing a purge fluid passage positioned adjacent the substrate receiving surface to deliver a purge fluid to the edge of the substrate when received on the substrate receiving surface;

locating a substrate on the substrate support member;

aligning the substrate on the substrate support member so that the edge of the substrate is adjacent the purge fluid passage; and aligning a guide ring on the substrate support member to form a purge fluid gap in fluid communication with the purge fluid passage, wherein the guide ring includes a substrate alignment member thereon; and delivering a purge fluid through the purge fluid passage to the edge of the substrate on the substrate receiving surface.

* * * * *

UNITED STATES PATENT AND TRADEMARK OFFICE
CERTIFICATE OF CORRECTION

PATENT NO. : 5,800,686
DATED : September 1, 1998
INVENTOR(S) : Karl Littau, Lawrence Chung-Lai Lei It is certified that error appears in the above-identified patent and that said Letters Patent is hereby corrected as shown below:

On the title page, item [75]:

in the inventors section, please replace "Chung-lai" with --Chung-Lai--.

In column 17, line 55, after "of" please delete "at" and replace it with --a--.

Signed and Sealed this

Twenty-second Day of June, 1999

Attest:

Q. TODD DICKINSON

*Attesting Officer*   Acting Commissioner of Patents and Trademarks